(12) United States Patent
Chu et al.

(10) Patent No.: US 8,756,028 B2
(45) Date of Patent: Jun. 17, 2014

(54) FAULT DETECTION METHOD OF SEMICONDUCTOR MANUFACTURING PROCESSES AND SYSTEM ARCHITECTURE THEREOF

(75) Inventors: Yij Chieh Chu, New Taipei (TW); Yun-Zong Tian, Taichung (TW)

(73) Assignee: Inotera Memories, Inc., Taoyuan County (TW)

( * ) Notice: Subject to any disclaimer, the term of this patent is extended or adjusted under 35 U.S.C. 154(b) by 356 days.

(21) Appl. No.: 13/240,348

(22) Filed: Sep. 22, 2011

(65) Prior Publication Data

US 2012/0330591 A1 Dec. 27, 2012

(30) Foreign Application Priority Data

Jun. 22, 2011 (TW) .............................. 100121808 A

(51) Int. Cl.
*G06F 19/00* (2011.01)
*H01L 21/66* (2006.01)
*G06T 7/00* (2006.01)

(52) U.S. Cl.
CPC ................. *G06F 19/00* (2013.01); *H01L 22/20* (2013.01); *H01L 22/14* (2013.01); *H01L 22/12* (2013.01); *G06T 7/001* (2013.01); *G06T 2207/30148* (2013.01)
USPC .............. 702/81; 382/141; 700/101; 702/182

(58) Field of Classification Search
CPC .............. G06F 19/00; G05B 19/41865; G05B 19/41875; G05B 2219/323; G05B 2219/40938; H01L 22/006; H01L 22/20; G06T 7/001; G06T 2207/30148
USPC .............. 702/81, 82, 116, 179, 182; 382/141, 382/144; 700/20, 101, 102, 121; 703/14
See application file for complete search history.

(56) References Cited

U.S. PATENT DOCUMENTS

| | | | | |
|---|---|---|---|---|
| 6,615,157 | B1 * | 9/2003 | Tsai | ............................... 702/179 |
| 7,127,304 | B1 * | 10/2006 | Gould et al. | ..................... 700/20 |
| 7,974,723 | B2 * | 7/2011 | Moyne et al. | ................. 700/101 |
| 8,126,255 | B2 * | 2/2012 | Bhaskar et al. | ............... 382/141 |
| 2009/0080759 | A1 | 3/2009 | Bhaskar et al. | |
| 2009/0228129 | A1 | 9/2009 | Moyne et al. | |

FOREIGN PATENT DOCUMENTS

| | | |
|---|---|---|
| TW | 200410349 | 6/2004 |
| TW | 200411801 | 7/2004 |
| TW | 200425371 | 11/2004 |

OTHER PUBLICATIONS

Communication from the Taiwan Patent Office regarding a counterpart foreign application dated (Taiwan Year 103) Feb. 21, 2014.

* cited by examiner

*Primary Examiner* — John H Le
(74) *Attorney, Agent, or Firm* — Rosenberg, Klein & Lee

(57) ABSTRACT

A fault detection method of semiconductor manufacturing processes is disclosed. The method includes the steps of providing a storage device, collecting a fault detection and classification(FDC) parameter by the storage device, setting up a measurement site for measuring an online measurement parameter, collecting a wafer acceptance test(WAT) in correspondence to the FDC parameter, establishing a first relationship equation between the FDC parameter and the online measurement parameter, establishing a second relationship equation of the online measurement parameter and the WAT by using the first relationship equation, establishing a third relationship equation between the FDC parameter and the WAT, establishing a waning region of the manufacturing processes by using the first, second, and third relationship equations, and determining the situation of generating wafer defects according to the warning region. The present invention discloses a system architecture for the method.

9 Claims, 9 Drawing Sheets

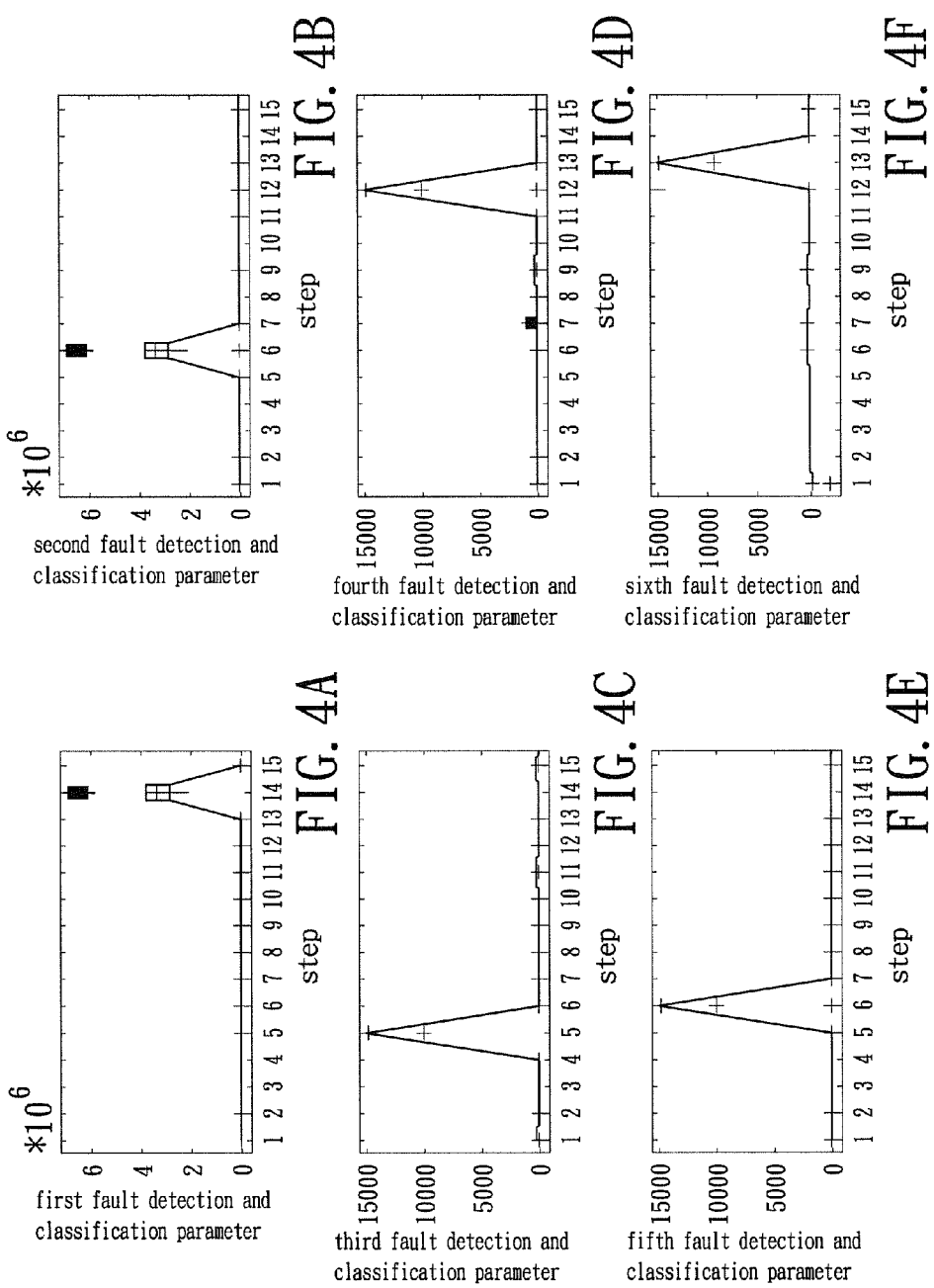

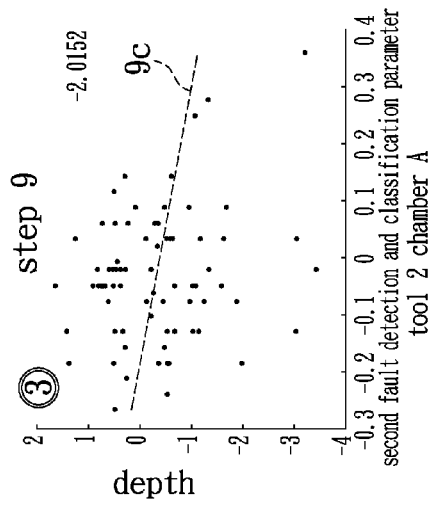
FIG. 9C
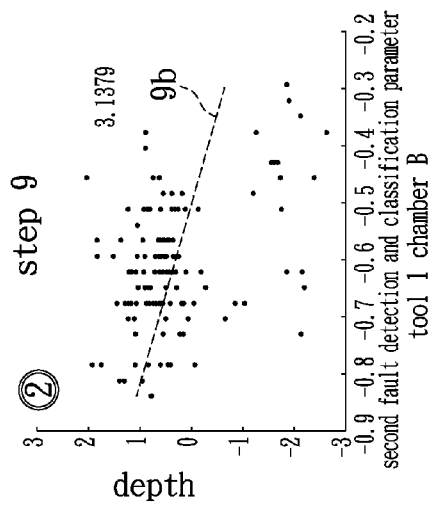
FIG. 9B
FIG. 9E
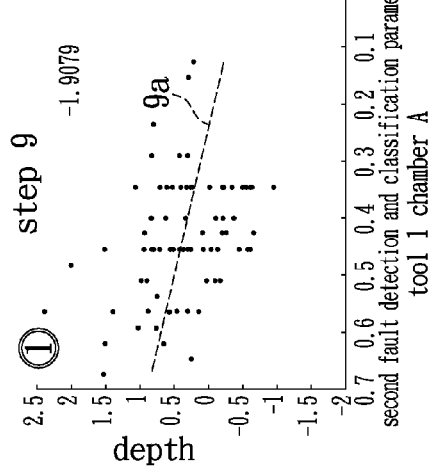
FIG. 9A
FIG. 9D
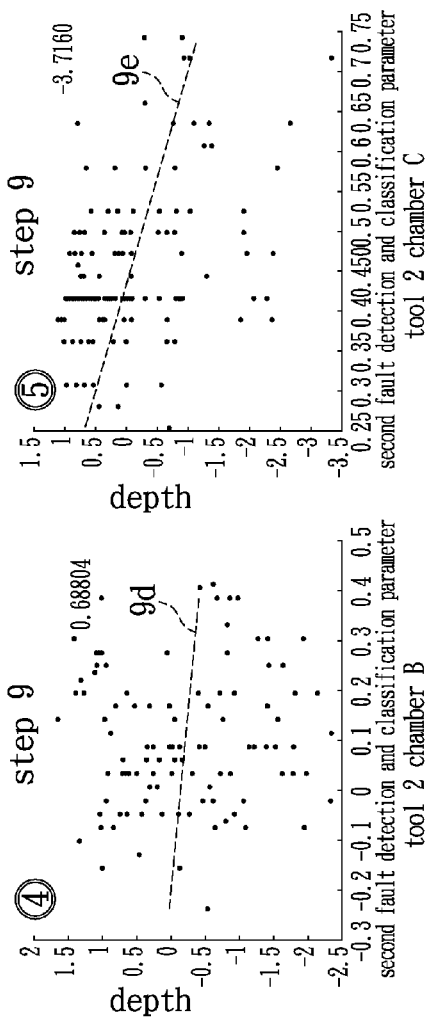

FAULT DETECTION METHOD OF SEMICONDUCTOR MANUFACTURING PROCESSES AND SYSTEM ARCHITECTURE THEREOF

BACKGROUND OF THE INVENTION

1. Field of the Invention

The present invention relates to a fault detection method; in particular, to a fault detection method adaptable in semiconductor manufacturing processes and system architecture of implementing the same.

2. Description of Related Art

Conventional semiconductor manufacturing equipment is configured to carry out various complicated tasks, including wafer transportation and other manufacturing processes. To ensure proper functioning of the equipment, every step of a manufacturing process, each of which generates a great amount of parameter data (such as temperatures and pressures, etc.), needs to be carefully and constantly monitored.

However, real time monitoring of the operating parameters of modern complex manufacturing equipment requires the recordation and analysis of a great volume of data. Therefore, the engineers of a semiconductor plant may consume time and energy in monitoring and analyzing the aforementioned data for determining whether problems occurred during the manufacturing processes that would in turn cause wafer defects, resulting in reduction of yield/ production rates.

In order to increase the yield rate of manufacturing processes, it is an inevitable trend to adapt a monitoring system in a semiconductor manufacturing process to process the great amount of monitoring data. However, conventional monitoring systems often employ complicated mathematical calculating models that lack practicability.

SUMMARY OF THE INVENTION

One object of the present invention is to provide a fault detection method adaptable in a semiconductor manufacturing process and a system architecture for executing the method, which may provide significant improvement over conventional monitoring systems that possess the problems of practicability, yield rate, and production rate reductions due to the employment of complicated calculating models for processing the great amount of data.

In order to achieve the aforementioned objects, according to an embodiment of the present invention, a fault detection method of semiconductor manufacturing processes is disclosed. The method includes steps of 1) providing at least one storage device, 2) storing in the storage device a plurality of fault detection and classification (FDC) parameters, 3) setting up a plurality of measurement sites for measuring a plurality of online measurement parameters, 4) collecting a plurality of wafer acceptance test parameters (WAT) parameters corresponding to the fault detection and classification parameters, 5) establishing a first relationship equation between the fault detection and classification parameters and the online measurement parameters, 6) establishing a second relationship equation between the online measurement parameters and the wafer acceptance test parameters WAT parameter by using the first relationship equation, 7) establishing a third relationship equation of the fault detection and classification parameters and the wafer acceptance test parameters, 8) establishing a warning region by using the first relationship equation, the second relationship equation, and the third relationship equation for detecting manufacturing process defects, and 9) applying the warning region obtained above to determine the defect generation condition of the semiconductor manufacturing processes.

Accordingly, the embodiments of the present invention provide a fault detection method of semiconductor manufacturing processes and the system architecture for executing the method, which systematize and integrate the great volumes of the fault detection and classification parameters, the online measurement parameters, and the wafer acceptance test parameters. Therefore, the engineers of wafer manufacturing processes in the semiconductor plant may determine whether each of the parameters exceeds safety range or not. Moreover, the embodiments of the present invention may simplify the complicated calculation functions of the monitoring system, and may increase the usage convenience, the manufacturing yield rate, and the production rate.

For further understanding of the present disclosure, reference is made to the following detailed description illustrating the embodiments and examples of the present disclosure. The description is only for illustrating the present disclosure, not for limiting the scope of the claim.

BRIEF DESCRIPTION OF THE DRAWINGS

The drawings included herein provide further understanding of the present disclosure. A brief introduction of the drawings is as follows:

FIG. 4A shows a curve distribution diagram of first fault detection and classification parameters according to an embodiment of the present invention;

FIG. 4B shows a curve distribution diagram of second fault detection and classification parameters according to an embodiment of the present invention;

FIG. 4C shows a curve distribution diagram of third fault detection and classification parameters according to an embodiment of the present invention;

FIG. 4D shows a curve distribution diagram of fourth fault detection and classification parameters according to an embodiment of the present invention;

FIG. 4E shows a curve distribution diagram of fifth fault detection and classification parameters according to an embodiment of the present invention;

FIG. 4F shows a curve distribution diagram of sixth fault detection and classification parameters according to an embodiment of the present invention;

FIG. 9A shows a curve distribution diagram of an etching depth corresponding to third fault detection and classification parameters on a chamber A of tool 1 according to an embodiment of the present invention;

FIG. 9B shows a curve distribution diagram of an etching depth corresponding to third fault detection and classification parameters on a chamber B of tool 1 according to an embodiment of the present invention;

FIG. 9C shows a curve distribution diagram of an etching depth corresponding to third fault detection and classification parameters on a chamber A of tool 2 according to an embodiment of the present invention;

FIG. 9D shows a curve distribution diagram of an etching depth corresponding to third fault detection and classification parameters on a chamber B of tool 2 according to an embodiment of the present invention;

FIG. 9E shows a curve distribution diagram of an etching depth corresponding to third fault detection and classification parameters on a chamber C of tool 2 according to an embodiment of the present invention.

DETAILED DESCRIPTION OF THE PREFERRED EMBODIMENTS

The aforementioned illustrations and following detailed descriptions are exemplary for the purpose of further explaining the scope of the present invention. Other objectives and advantages related to the present invention will be illustrated in the subsequent descriptions and appended drawings.

Figure 1:
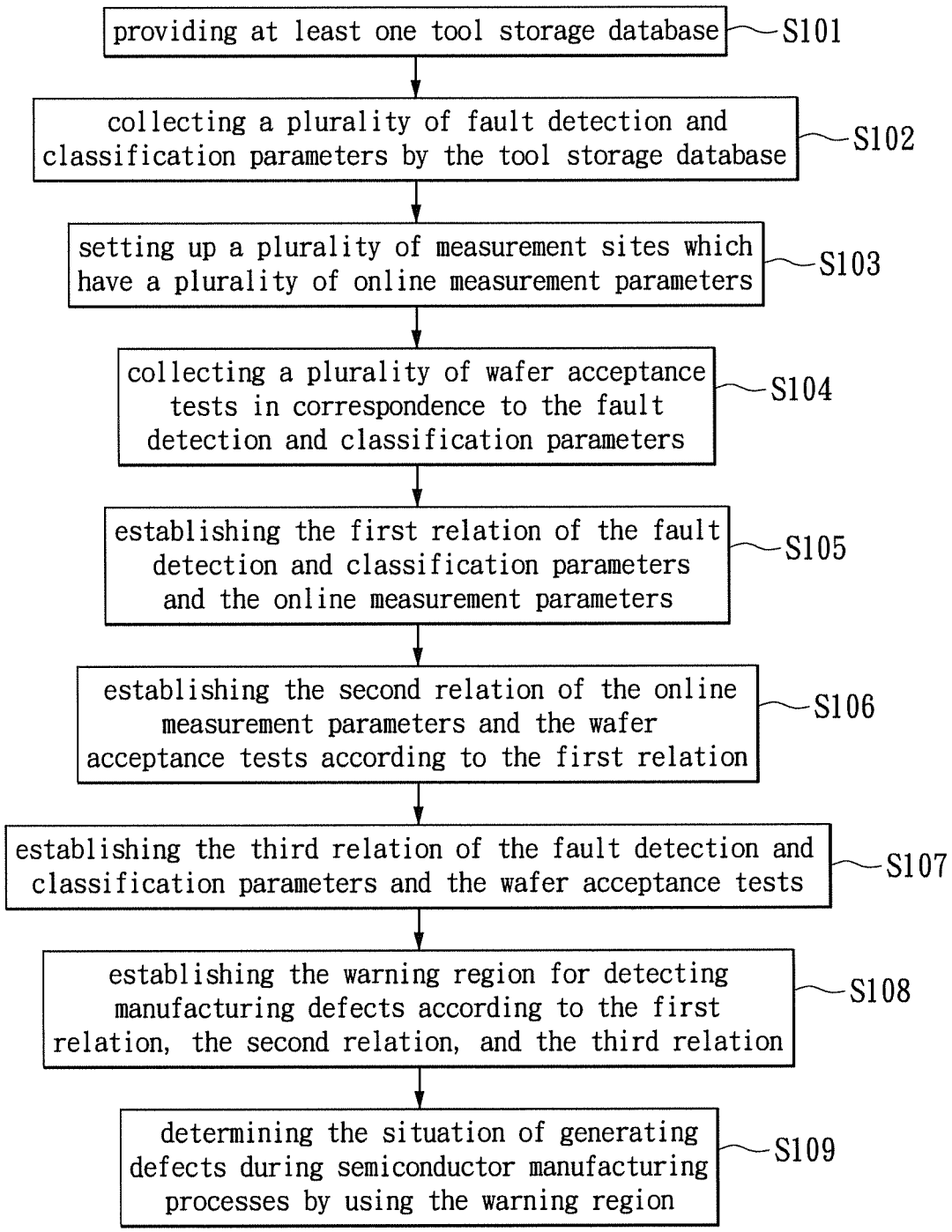
FIG. 1 shows a flow chart according to the present invention.

Please refer to FIG. 1 which shows a flow chart of fault detection method of semiconductor manufacturing processes according to a first embodiment of the present invention. Specifically, the method may be used in an etching process, and may also be used in other relative manufacturing processes of the semiconductors. The scope of the present invention is not limited thereby. The fault detection method includes steps described as follows.

Figure 10:
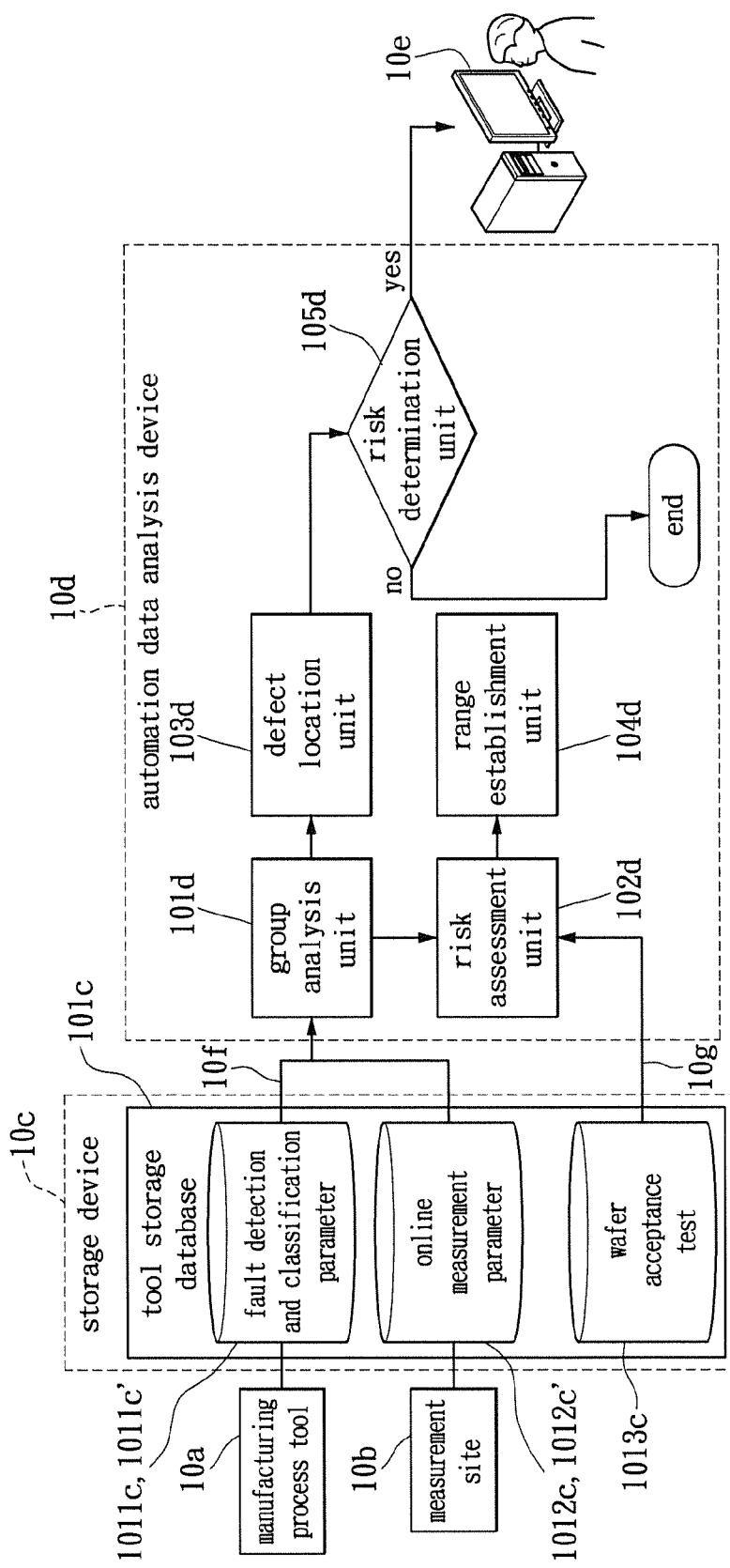
FIG. 10 shows a structure diagram of a system architecture for executing the fault detection method according to an embodiment of the present invention.

Please refer to FIG. 10 along with FIG. 1. The method includes a step S101 of providing at least one storage device 101c. A tool is data linked to a storage device 10c having the storage device 101c. The storage device 101c of the storage device 10c includes several process tool parameters.

The method includes a step S102 of collecting a plurality of fault detection and classification (FDC) parameters 1011c from the storage device 101c. The grouped parameter data (such as the fault detection and classification parameters) of a manufacturing process tool 10a is analyzed, and then the analysis results are used for establishing the monitoring system, in order to detect manufacturing defects of wafer processes. In addition, the monitoring system may be integrated with the fault detection and classification parameters 1011c for providing real time monitoring of manufacturing defects in wafer plants.

A step S103 of setting up a plurality of measurement sites 10b which are used for measuring several online measurement parameters 1012c is included. The measurement sites 10b may measure the parameters of the manufacturing process tool 10a during the wafer manufacturing processes are executing, and the result may serve as a quality indicator.

The method further includes a step S104 of collecting a plurality of wafer acceptance test parameters (WAT) 1013c in correspondence to the fault detection and classification parameters 1011c. After several manufacturing processes, a reference data of the wafer acceptance test parameters 1013c may be generated, and the engineers may determine whether the wafers have defects or not by monitoring the wafer acceptance test parameters 1013c.

The method also includes a step S105 of establishing a first relationship equation of the fault detection and classification parameters 1011c and the online measurement parameters 1012c. After that, a step of calculating the online measurement parameters 1012c for obtaining a plurality of standardized online measurement parameters 1012c' (not shown in FIG. 10).

The math function for establishing the standardized online measurement parameters 1012c' is:

$$Inline'_i = \frac{Inline_i - \overline{Inline}}{S_{Inline}}$$

$Inline_i$ is the ith online measurement parameters 1012c, $\overline{Inline}$ is an average value of the online measurement parameters 1012c, $S_{Inline}$ equals to a standard deviation of the online measurement parameters 1012c divided by a square root of a sample number, and $Inline_i'$ is the ith standardized online measurement parameters 1012c'.

The method may also include a step of calculating the fault detection and classification parameters 1011c, for obtaining several standardized fault detection and classification parameters 1011c' (not shown in FIG. 10).

The equation for establishing the standardized fault detection and classification parameters 1011c' is:

$$FDC'_j = \frac{FDC_j - \overline{FDC}}{S_{FDC}}$$

$FDC_j$ is the jth fault detection and classification parameters 1011c, $\overline{FDC}$ is an average value of the fault detection and classification parameters 1011c, $S_{FDC}$ equals to a standard deviation of the fault detection and classification parameters 1011c divided by the square root of the sample number, and $FDC_j'$ is the jth standardized fault detection and classification parameters 1011c'.

The first relationship equation of the fault detection and classification parameters 1011c and the online measurement parameters 1012c is:

$$Inliné = \beta_2 FDC$$

$\beta_2$ is a connection coefficient between the standardized online measurement parameters 1012c' and the standardized fault detection and classification parameters 1011c'.

A step of establishing the relationship equation between the fault detection and classification parameters 1011c and the online measurement parameters 1012c may also be included. The engineer may use the aforementioned relationship equations for monitoring the manufacturing processes, and when the online measurement parameters 1012c shifts, the engineer may trace and find out which fault detection and classification parameters 1011c influence the online measurement parameters 1012c. The engineer may also adjust the parameters at a proper moment for reducing the possibility of generating wafer defects.

Figure 2:
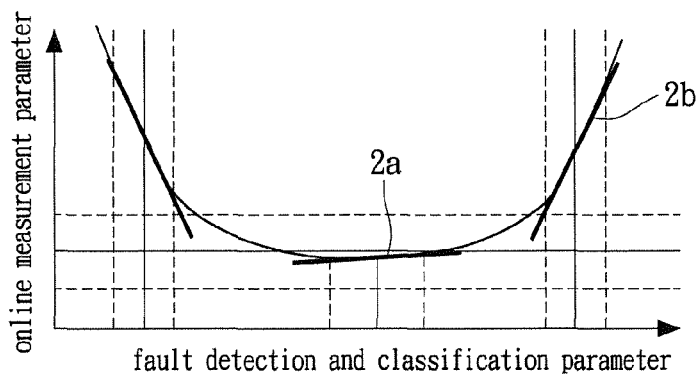
FIG. 2 shows a curve distribution diagram of fault detection and classification parameters and online measurement parameters according to an embodiment of the present invention.

Please refer to FIG. 2 which is a curve distribution diagram of the fault detection and classification parameters 1011c and the online measurement parameters 1012c (see FIG. 10 correspondingly). When the corresponding curve 2a is distributed smoothly in correspondence to the horizontal axis, that means the online measurement parameters 1012c and the fault detection and classification parameters 1011c are in spec. On the other hand, when the corresponding curve 2a is distributed steeply in correspondence to the horizontal axis, that means the online measurement parameters 1012c and the fault detection and classification parameters 1011c are out spec. At the moment, the engineer may adjust the fault detection and classification parameters 1011c of the manufacturing process tool 10a properly, for eliminating wafer defects.

The method further includes a step of calculating a standardized) $\beta_2$, and deriving a test statistic function which is:

$$t^* = \frac{\beta_2}{S_{\beta_2}} = \cot(\theta)$$

$S_{\beta_2}$ equals to a standard deviation of the connection coefficient divided by the square root of the sample number, $t^*$ is a quantity of a test statistic of $S_{\beta_2}$ and the connection coefficient, and $\theta$ is an included angle between $S_{\beta_2}$ and the connection coefficient.

Moreover, the complex conversion of the test statistic function is:

$$Z = \cot(\theta)$$

Z is a complex value of the test statistic function after being converted. Determination functions are further defined as follows:

When $Z>0$, $\cot^{-1}(Z)<\theta$; and
When $Z<0$, $\cot^{-1}(Z)>\theta$.

A step S106 may be included. Please refer to FIG. 10 along with FIG. 1, a second relationship equation of the online measurement parameters 1012c and the wafer acceptance test parameters 1013c is established by using the first relationship equation. The second relationship equations for deriving the possibility of generating manufacturing errors between the online measurement parameters 1012c and the wafer acceptance test parameters 1013c are:

$$\pi_1(w) = P\{\text{WAT out spec./Inline'}\}$$

$$\log \text{it}(\pi_1(w)) = \alpha_1 + \beta_1 \text{Inline'}$$

In which, w is a number of the wafer acceptance test parameters 1013c which exceed a standard value, $\pi_1(w)$ is a probability of the wafer acceptance test parameters 1013c which exceed the standard value, $P\{\text{WAT out spec./Inline'}\}$ is a probability of the standardized wafer acceptance test parameters 1013c in correspondence to the online measurement parameters 1012c, and $\alpha_1$ and $\beta_1$ are coefficients of a curve approach function.

The method further includes a step S107 of establishing a third relationship equation of fault detection and classification parameters 1011c and the wafer acceptance test parameters 1013c. The third relationship equations for deriving the possibility of generating manufacturing errors between the fault detection and classification parameters 1011c and the wafer acceptance test parameters 1013c are:

$$\pi_2(w) = P\{\text{WAT out spec./FDC'}\}$$

$$\log \text{it}(\pi_2(w)) = \alpha + \beta \text{FDC'}$$

w is the number of the wafer acceptance test parameters which exceed the standard value, $\pi_2(w)$ is the probability of the wafer acceptance test parameters which exceed the standard value, $P\{\text{WAT out spec./FDC'}\}$ is a probability of the standardized wafer acceptance test parameters in correspondence to the fault detection and classification parameters, and $\alpha$ and $\beta$ are coefficients of the curve approach function.

A relationship equation derived from the third relationship equation may be:

$$(1-x) \leq e^{\beta} \leq (1+x)$$

$e^{\beta}$ is an exponential function of $\beta$, and x is a variable after calculation.

A relationship equation derived from the second relationship equation and the third relationship equation may be:

$$A \leq \beta_2 \leq B$$

A is a first value after calculation, and B is a second value after calculation.

When $\beta_1 > 0$, the derived first and second values are:

$$A = \frac{\log(1-x)}{\beta_1} \quad B = \frac{\log(1+x)}{\beta_1}$$

When $\beta_1 < 0$, the derived first and second values are:

$$A = \frac{\log(1-x)}{\beta_1} \quad B = \frac{\log(1+x)}{\beta_1}$$

A minimum value C of the first and the second values is defined by using the relationship equations between the first value and the second value. The minimum value C equals:

$$C = \min\{/A/, /B/\}$$

Figure 3:
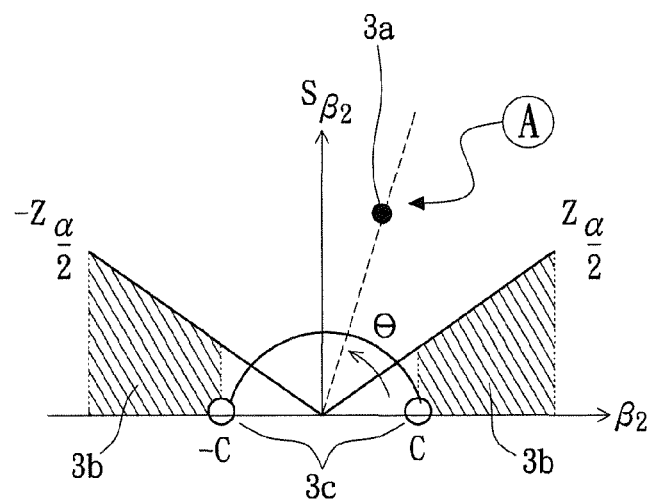
FIG. 3 shows a mapping diagram of complex number conversion according to an embodiment of the present invention.
Figure 3A:
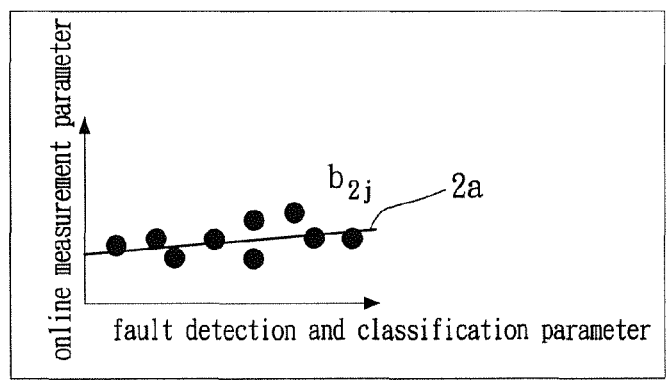
FIG. 3A shows a curve distribution diagram of manufacturing defects of fault detection and classification parameters and the online measurement parameters according to an embodiment of the present invention.

Please refer to FIG. 3 and FIG. 3A along with FIG. 1. The method also includes a step S108 of establishing a warning region 3b for detecting manufacturing errors according to the first relationship equation, the second relationship equation, and the third relationship equation. The determination functions generated according to the test statistic function, the first value, and the second value are:

$\theta < \cot^{-1}(Z)$ or $\cot^{-1}(-Z) > \theta$;
and $A > \beta_2$ or $\beta_2 > B$.

A step S109 of determining whether there is defect generated or not during the manufacturing processes according to the warning region 3b may also be included.

Please refer to FIG. 3 and FIG. 3A, the standardized $\beta_2$ is subject to complex conversion to obtain a pair of warning regions 3b. When a defect point 3a falls out of the warning region 3b, that means the possibility of generating wafer defects is low. In other words, when the corresponding curve 2a is distributed smoothly relative to the horizontal axis (as shown in FIG. 3A), that means the online measurement parameters 1012c and the fault detection and classification parameters 1011c are in spec. On the other hand, when the defect point 3c falls in the warning region 3b, that means the possibility of generating wafer defects is relatively high. Under this situation, the engineer may adjust the manufacturing process parameters at proper time, for avoiding yield rate reduction. The following disclosed experiment data and results are for reference.

Please refer to FIG. 10. During etching manufacturing processes, there are 15 manufacturing steps which using 520 pieces of wafers as samples. Furthermore, the parameter data of the chambers A and B of the tool 1 and the chambers A, B, C of the tool 2 are collected for being used as references. In addition, each of the measurement sites 10b of this experiment uses the etching depth as a reference value of the online measurement parameters 1012c. Moreover, the first fault detection and classification parameters (FDC1), the second fault detection and classification parameters (FDC2), the third fault detection and classification parameters (FDC3), the fourth fault detection and classification parameters (FDC4), the fifth fault detection and classification parameters (FDC5), and the sixth fault detection and classification parameters (FDC6) are used as parameter data for monitoring.

In addition, the first wafer acceptance test (WAT1), the second wafer acceptance test (WAT2), and the third wafer acceptance test (WAT3) are also used as parameter data for monitoring.

Please refer to FIGS. 4A to 4F which shows relationship equations between fault detection and classification parameters 1011c and each manufacturing process step (also refer to FIG. 10). Take the first fault detection and classification parameter (FDC1) for example, when the etching manufacturing process goes to the 14th step, the first fault detection and classification parameter may be derived, which equals to $4 \times 10^6$, according to the changes of the curve. Similarly, the second fault detection and classification parameters (FDC2), the third fault detection and classification parameters (FDC3), the fourth fault detection and classification parameters (FDC4), the fifth fault detection and classification parameters (FDC5), and the sixth fault detection and classification parameters (FDC6) are in correspondence to different manufacturing steps and may generate different changes of parameters. By coordinating the parameter data with the online measurement parameters and the wafer acceptance test parameters, the problems of parameters may be found out and be properly adjusted.

Figure 5:
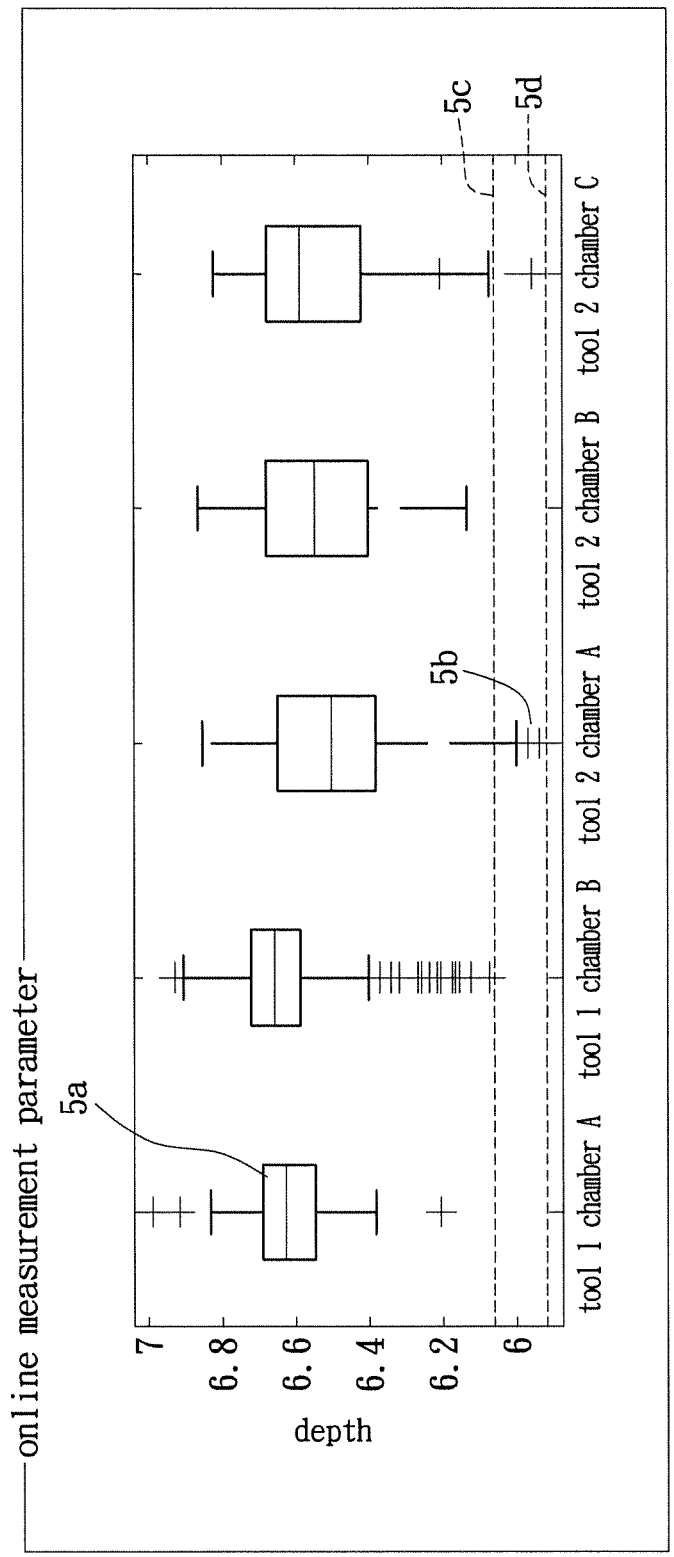
FIG. 5 shows a curve distribution diagram of online measurement parameters according to an embodiment of the present invention.

Please refer to FIG. 5 which shows relationship equations between different chambers of tools and the corresponding etching depths. A spec target of the standard value 5d of etching depth and a spec high of the upper limit 5c are configured for being used as determination basis. Take chamber A of the tool 1 for example, as shown in FIG. 5, when a majority of the etching depth of the defect judgment region 5a exceeds the high spec of the upper limit 5c, that means the possibility of generating wafer defects is relatively high. On the other hand, take the chamber A of the tool 2 as an example, if a majority of the etching depth of the defect judgment region 5b lies between the high spec of the upper limit 5c and the spec target of the standard value 5d, that means the possibility of generating wafer defects is relatively low.

Figure 6:
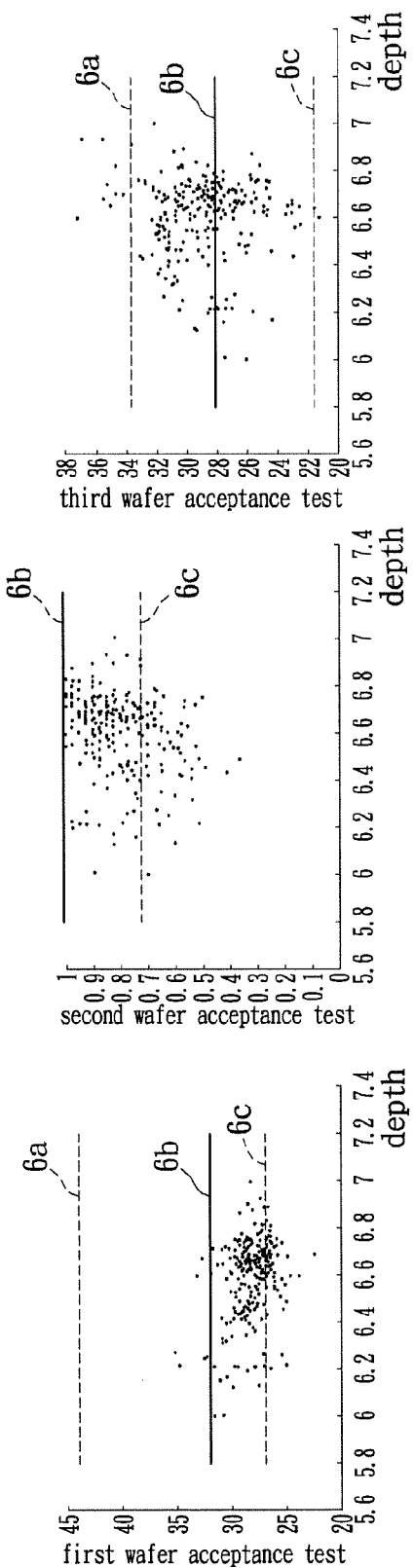
FIG. 6A shows a curve distribution diagram of first wafer acceptance test parameters according to an embodiment of the present invention.
FIG. 6B shows a curve distribution diagram of second wafer acceptance test parameters according to an embodiment of the present invention.
FIG. 6C shows a curve distribution diagram of third wafer acceptance test parameters according to an embodiment of the present invention.

Please refer to FIG. 6A to 6C which indicate relationship equations between the wafer acceptance test parameters 1013c and the corresponding etching depths (coordinating with FIG. 10). The safe range of the wafer acceptance test parameters 1013c is between an upper limit 6a and a lower limit 6c.

Take the third wafer acceptance test parameters (WAT3) as an example, every point in FIG. 6C represents a relationship equation between the etching depth of wafer manufacturing processes and the third wafer acceptance test parameters (WAT3). In addition, as shown in FIG. 6C, most of the points are located between the upper limit 6a and the lower limit 6c, and also lie in the allowable parameter range of the standard value 6b. Thus, the third wafer acceptance test parameters (WAT3) may be an optimal selection of parameter configuration.

On the other hand, if the points in the figure lie below the lower limit 6c (for example, the first wafer acceptance test and the second acceptance test) or above the upper limit 6a, that means the possibility of generating wafer defects may be relatively high. Therefore, by integrating the aforementioned parameter data, the problems of parameter configuration in manufacturing processes may be easily determined, and may be adjusted at proper time.

A reference of experimental result list is as follows:

| FDC NO. | Parameter Name | Step | Tool/Chamber | Theta | Radius |
|---|---|---|---|---|---|
| 17 | FDC5 | 3 | Tool1/A | 3.64 | 5.55 |
| 40 | FDC4 | 7 | Tool1/A | 3.71 | 5.39 |
| 69 | FDC3 | 12 | Tool1/A | 3.71 | 5.39 |
| 55 | FDC2 | 9 | Tool2/C | −10.58 | −3.72 |
| 55 | FDC2 | 9 | Tool1/B | −9.02 | −3.14 |
| 37 | FDC1 | 7 | Tool2/A | −16.83 | −2.57 |
| 55 | FDC2 | 9 | Tool1/A | −13.50 | −1.91 |

Figure 7:
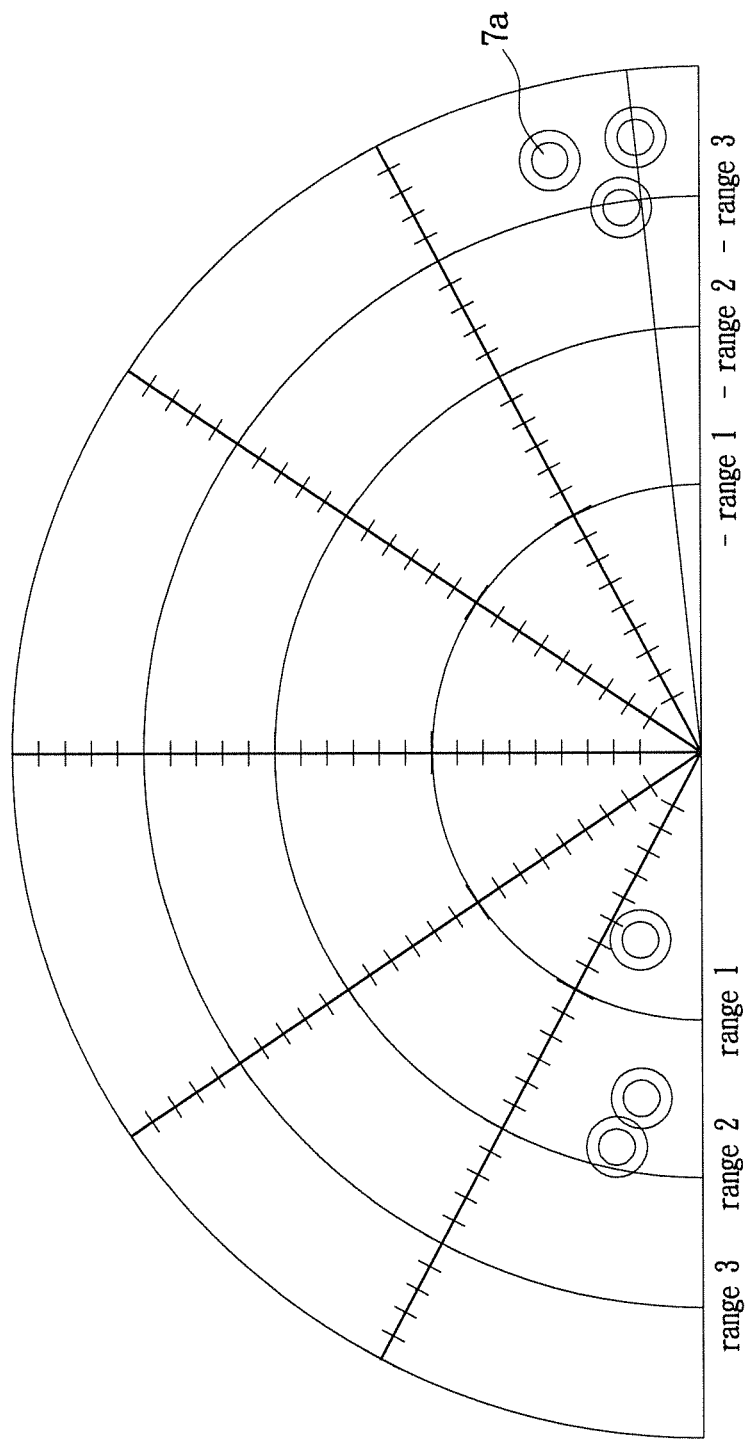
FIG. 7 shows an image display diagram of fault detection and classification parameters displaying on the image display device according to an embodiment of the present invention.

Take the experimental result of the parameter name which is FDC5 corresponding to the chamber A of the tool 1 in manufacturing step 3 as an example. Please refer to FIG. 7 which shows a screen of the experimental data being transmitted to an image display device 10e (please see FIG. 10). The wafer defect generation problem may be determined according to the location of the defect points 7a (such as the distance to the center of the circle). In FIG. 7, there are 6 defect points 7a are distributed in each of the predetermined parameter ranges (such as range 1, range 2, and range 3), which represents the situation of generating wafer defects in the predetermined parameter range in correspondence to the defect points 7a. In other words, if the included angle between the defect points 7a and the center of the circle is smaller, that means the risk of generating wafer defects may be low. The parameter configuration of the reference name FDC5 in correspondence to the chamber A of tool 1 in the manufacturing step 3 may exceed the predetermined range, thus the engineer may need to adjust the value of the parameters. By using the aforementioned manners, the parameters FDC4 and FDC3 of the chamber A of tool 1 may also be determined for further adjustments.

Figure 8A:
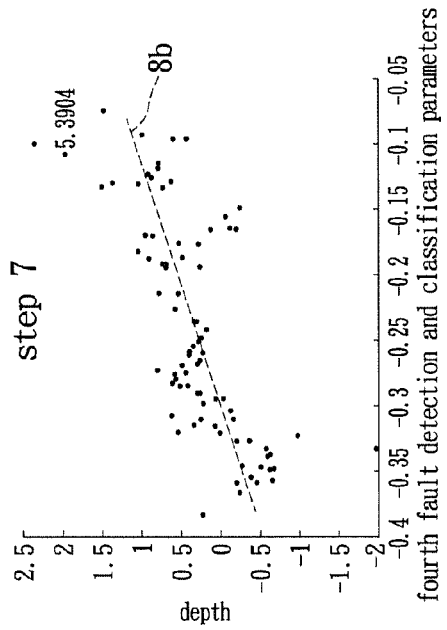
FIG. 8A shows a curve distribution diagram of an etching depth corresponding to fifth fault detection and classification parameters according to an embodiment of the present invention.
Figure 8B:
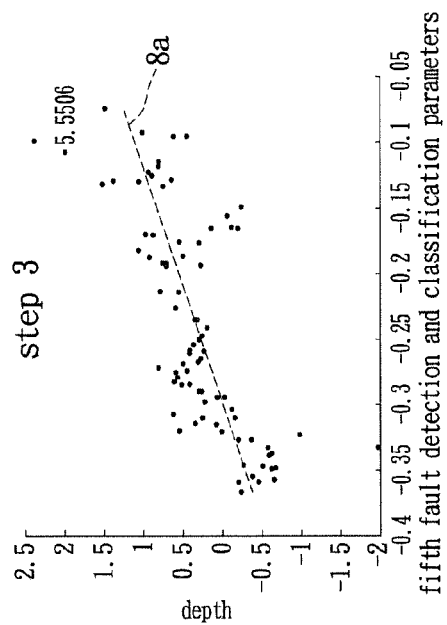
FIG. 8B shows a curve distribution diagram of an etching depth corresponding to fourth fault detection and classification parameters according to an embodiment of the present invention.
Figure 8C:
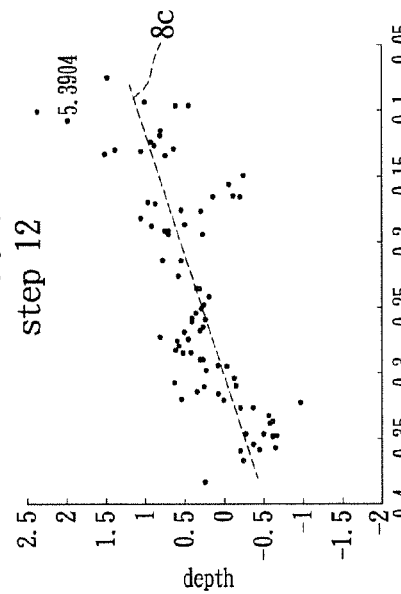
FIG. 8C shows a curve distribution diagram of an etching depth corresponding to third fault detection and classification parameters according to an embodiment of the present invention.

Please refer to FIG. 8A to 8C which show distribution diagrams of the fault detection and classification parameters 1011c and the etching depths. See FIG. 10 along with FIG. 8A to 8C. The corresponding curves 8a, 8b, 8c in correspondence to the etching depths and the parameters FDC5, FDC4, and FDC3 of the chamber A of the tool 1 relatively are all steep relative to the horizontal axis. That is, the configuration of the parameters FDC5, FDC4, and FDC3 of the chamber A of the tool 1 may increase the possibility of generating defects, thus the parameters may need to be adjusted at proper time for preventing the aforementioned problems.

An additional remark of the determination of wafer defects is as follows. Please refer to FIG. 9A to 9E which show several curve distribution diagrams of the relationship equation between the fault detection and classification parameters $1011c$ and the etching depths, and also refer to FIG. 10 along with the FIG. 9A to 9E. Take the parameter FDC2 in the experimental result list as an example. There are 5 samples in FIG. 9, and each of the corresponding curves $9a, 9b, 9c, 9d, 9e$ of the samples are distributed steeply relative to the horizontal axis. That is, the parameter configurations of the chambers of the corresponding tools may increase the possibility of generating wafer defects, thus the parameters may need to be adjusted at proper time for preventing the aforementioned problems.

Please refer to FIG. 10 which shows a system architecture diagram for executing the fault detection method according to the present invention. The architecture may include a storage device $10c$, an automation data analysis device $10d$, and an image display device $10e$.

The storage device $10c$ has a storage device $101c$ which stores several fault detection and classification parameters $1011c$ of the manufacturing process tool $10a$, the online measurement parameters $1012c$ and the wafer acceptance test parameters $1013c$ of the measurement sites $10b$. The fault detection and classification parameters $1011c$ and the online measurement parameters $1012c$ may be grouped as a first data group $10f$, and the wafer acceptance test parameters $1013c$ may serve as a second data group $10g$. The first data group $10f$ may be the parameter data of a first relationship equation established by the fault detection and classification parameters $1011c$ and the online measurement parameters $1021c$. The second data group $10g$ may include parameter data of several wafer acceptance test parameters $1013c$.

The automation data analysis device $10d$ has a group analysis unit $101d$, a defect location unit $103d$, a risk assessment unit $102d$, a range establishment unit $104d$, and a risk determination unit $105d$.

The first data group is data linked with the group analysis unit $101d$, the group analysis unit $101d$ is data linked with the respective defect location unit $103d$ and the respective risk assessment unit $102d$, and the second data group $10g$ is data linked with the risk assessment unit $102d$. By using the first data group $10f$ and the second data group $10g$, the parameter data of the second relationship equation and the third relationship equation may be established. The established parameter data may be transmitted to the risk assessment unit $102d$ for determining whether the parameter configuration is appropriate or not. In addition, the defect location unit $103d$ may establish a curve distribution diagram by using the relationship equations between the fault detection and classification parameters $1011c$ and the online measurement parameters $1012c$, as shown in FIG. 2.

The risk assessment unit $102d$ is data linked to the range establishment unit $104d$, and may integrate the aforementioned parameter data to the range establishment unit $104d$. Then the range establishment unit $104d$ may be used to display that which parameter range may generate wafer defects.

After that, the defect location unit $103d$ and the range establishment unit $104d$ may be data linked to the risk determination unit $105d$. The risk determination unit $105d$ may be data linked with the image display device $10e$ for displaying the result of defects of the manufacturing processes on the screen of the image display device $10e$. The risk determination unit $105d$ may a logical determination on the collected parameter data. If the fault detection and classification parameters $1011c$ exceeds the predetermined range (out spec), the risk determination unit $105d$ may generate an output which indicates "yes". Then the parameter data may be transmitted to the image display device $10e$ (as shown in FIG. 7), in order to be used by the wafer manufacturing engineers as a reference for adjusting the parameters of the manufacturing processes. On the other hand, if the fault detection and classification parameters $1011c$ are within the predetermined range (in spec), the risk determination unit $105d$ may generate an output which indicates "no", and may stop the determination of the parameters. Then the determination of other manufacturing parameters may be executed repeatedly.

According to the fault detection method and the system architecture disclosed by the present invention, the method may systematically integrate the great amount of data including the fault detection and classification parameters, the online measurement parameters, and the wafer acceptance test parameters, which may make the engineers of wafer manufacturing to determine whether each of the parameters exceeds the safety range or not easily. Moreover, the complication of the monitoring system may be simplified, the convenience may be improved, and the yield rate and production rate may also be increased.

Some modifications of these examples, as well as other possibilities will, on reading or having read this description, or having comprehended these examples, will occur to those skilled in the art. Such modifications and variations are comprehended within this disclosure as described here and claimed below. The description above illustrates only a relative few specific embodiments and examples of the present disclosure. The present disclosure, indeed, does include various modifications and variations made to the structures and operations described herein, which still fall within the scope of the present disclosure as defined in the following claims.

What is claimed is:

1. A system architecture for executing a fault detection method of semiconductor manufacturing processes, comprising:
    at least one storage unit having a storage device which is configured to store a plurality of fault detection and classification parameters, online measurement parameters, and wafer acceptance test parameters, wherein the fault detection and classification parameters and the online measurement parameters are defined as a first data group, and the wafer acceptance test parameters are defined as a second data group;
    an automation data analysis device including:
    a group analysis unit data linked to the storage device, configured to set up the fault detection and classification parameters and the online measurement parameters to establish a first relationship equation;
    a risk assessment unit data linked to the group analysis unit, configured to accept the wafer acceptance test parameters in such a way that the group analysis unit is further configured to establish a second relationship equation based on the online measurement parameters and the wafer acceptance test parameters according to the first relationship equation and a third relationship equation based on the fault detection and classification parameters and the wafer acceptance test parameters;
    a defect location unit data linked to the group analysis, configured to establish a curve distribution diagram based on the fault detection and classification parameters and the online measurement parameters;

a range establishment unit data linked to the risk assessment unit, configured to establish a warning region according to the first, second, and third relationship equations; and a risk determination unit data linked to the defect location unit and the range establishment unit, configured to evaluate a defect generation condition of the semiconductor manufacturing processes by the warning region;

an image display device data linked to the risk determination unit for displaying the defect generation condition of the semiconductor manufacturing processes.

2. The system architecture for executing a fault detection method of semiconductor manufacturing processes according to claim 1, wherein the group analysis unit is further configured to calculate the online measurement parameters for obtaining a plurality of standardized online measurement parameters, wherein a math function of the standardized online measurement parameters is:

$$Inline'_i = \frac{Inline_i - \overline{Inline}}{S_{Inline}}$$

wherein $Inline_i$ is the ith online measurement parameter, $\overline{Inline}$ is an average value of the online measurement parameters, $S_{Inline}$ is defined by the standard deviation of an online measurement parameter divided by the square root of a sample number, and $Inline'_i$ is the ith standardized online measurement parameter;

wherein the method further includes a step of calculating the fault detection and classification parameters for obtaining a plurality of standardized fault detection and classification parameters, wherein a math function of the standardized fault detection and classification parameters is:

$$FDC'_j = \frac{FDC_j - \overline{FDC}}{S_{FDC}}$$

wherein $FDC_j$ is the jth fault detection and classification parameter, $\overline{FDC}$ is an average value of the fault detection and classification parameters, $S_{FDC}$ equals to a standard deviation of the fault detection and classification parameters divided by the square root of the sample number, and $FDC'_j$ is the jth standardized fault detection and classification parameter;

wherein the first relationship equation of the fault detection and classification parameters and the online measurement parameters is:

Inline'=$\beta_2$FDC' wherein $\beta_2$ is a first connection coefficient of the standardized online measurement parameters and the standardized fault detection and classification parameters.

3. The system architecture for executing a fault detection method of semiconductor manufacturing processes according to claim 2, wherein the group analysis unit is further configured to calculate a standardized $\beta_2$ and deriving a test statistic function which is:

$$t^* = \frac{\beta_2}{S_{\beta_2}} = \cot(\theta)$$

wherein $S_{\beta_2}$ equals to a standard deviation of the first connection coefficient divided by the square root of the sample number, $t^*$ is a test statistic of $S_{\beta_2}$ and the first connection coefficient, and $\theta$ is an included angle between $S_{\beta_2}$ and the first connection coefficient.

4. The system architecture for executing a fault detection method of semiconductor manufacturing processes according to claim 3, wherein the group analysis unit is further configured to deriving that a complex number conversion of the test statistic function is:

Z=cot($\theta$)

wherein Z is a complex value of the test statistic function, which is generated after the complex number conversion and further defines determination functions including:
when Z>0, $\cot^{-1}(Z)<\theta$; and when Z<0, $\cot^{-1}(Z)>\theta$.

5. The system architecture for executing a fault detection method of semiconductor manufacturing processes according to claim 4, wherein the second relationship equations of manufacturing error occurrence probabilities between the online measurement parameters and the wafer acceptance test parameters are:

$\pi_1(w)=P\{$WAT out spec./Inline '$\}$ log it($\pi_1(w)$)=$\alpha_1+\beta_1$Inline ' wherein w is a number of the wafer acceptance test parameters which exceed a standard value, $\pi_1(w)$ is a probability of the wafer acceptance test parameters which exceed the standard value, P{WAT out spec./Inline'} is a probability of the standardized wafer acceptance test parameters in correspondence to the online measurement parameters, and $\alpha_1$ and $\beta_1$ are coefficients of a curve approach function.

6. The system architecture for executing a fault detection method of semiconductor manufacturing processes according to claim 5, wherein the third relationship equations of manufacturing error occurrence probabilities between the fault detection and classification parameters and the wafer acceptance test parameters are:

$\pi_2(w)=P\{$WAT out spec./FDC'$\}$ log it ($\pi_2(w)$)=$\alpha+\beta$FDC' wherein w is the number of the wafer acceptance test parameters which exceed the standard value, $\pi_2(w)$ is the probability of the wafer acceptance test parameters which exceed the standard value, P{WAT out spec./FDC'} is a probability of the standardized wafer acceptance test parameters in correspondence to the fault detection and classification parameters, and $\alpha$ and $\beta$ are coefficients of the curve approach function.

7. The system architecture for executing a fault detection method of semiconductor manufacturing processes according to claim 6, wherein a relationship equation derived from the third relationship equations is:

(1−x)≤$e^\beta$≤(1+x)

wherein $e^\beta$ is an exponential function of $\beta$, x is a variable after calculation.

8. The system architecture for executing a fault detection method of semiconductor manufacturing processes according to claim 7, wherein a relationship equation derived from the second relationship equation and the third relationship equation is:

A≤$\beta_2$≤B wherein A is a first value after calculation, and B is a second value after calculation;

when $\beta_1 > 0$, the derived first value and the second value are:

$$A = \frac{\log(1-x)}{\beta_1} \quad B = \frac{\log(1+x)}{\beta_1}$$

when $\beta_1 < 0$, the derived first value and the second value are:

$$A = \frac{\log(1-x)}{\beta_1} \quad B = \frac{\log(1+x)}{\beta_1}$$

furthermore, a minimum C which is a minimum value of the first value and the second value is defined by the relationship equations of the first value and the second value, wherein C equals:

$$C = \min\{/A/,/B/\}.$$

9. The system architecture for executing a fault detection method of semiconductor manufacturing processes according to claim 8, wherein determination functions of the warning region are generated by using the test statistic function, the first value, and the second value, and the determination functions include:

$$\cot^{-1}(-Z) > \theta \text{ or } \theta < \cot^{-1}(Z), \text{ and}$$

$$A > \beta_2 \text{ or } \beta_2 > B$$

wherein the determination functions of the warning region are used for determining whether there is a defect generated during the manufacturing processes.

* * * * *